(12) United States Patent
Craske (10) Patent No.: US 7,859,937 B2
(45) Date of Patent: Dec. 28, 2010

(54) APPARATUS AND METHOD FOR CONTROLLING WRITE ACCESS TO A GROUP OF STORAGE ELEMENTS

(75) Inventor: Simon John Craske, Cambridge (GB)

(73) Assignee: ARM Limited, Cambridge (GB)

( * ) Notice: Subject to any disclaimer, the term of this patent is extended or adjusted under 35 U.S.C. 154(b) by 164 days.

(21) Appl. No.: 12/318,920

(22) Filed: Jan. 12, 2009

(65) Prior Publication Data

US 2010/0177575 A1 Jul. 15, 2010

(51) Int. Cl.
*G11C 8/00* (2006.01)
(52) U.S. Cl. .......................... 365/230.01; 365/230.02; 365/189.01; 365/189.07
(58) Field of Classification Search ............ 365/230.02, 365/189.01, 189.07
See application file for complete search history.

(56) References Cited

U.S. PATENT DOCUMENTS

| | | | | |
|---|---|---|---|---|
| 6,442,058 | B2 * | 8/2002 | Mori | 365/103 |
| 2005/0078548 | A1 * | 4/2005 | Kang et al. | 365/232 |
| 2009/0063808 | A1 * | 3/2009 | Matsuyama et al. | 711/200 |

* cited by examiner

*Primary Examiner*—Connie C Yoha
(74) *Attorney, Agent, or Firm*—Nixon & Vanderhye P.C.

(57) ABSTRACT

An apparatus and method for controlling write access to a group of storage elements is provided. Each storage element within the group is identified by an n-bit address, and the total number of storage elements in the group is less than $2^n$. Write enable circuitry is responsive to an access request specifying an n-bit address to issue a write control signal to the storage element addressed by the access request in the event that the access request is a write access request. The write control signal causes a write to that addressed storage element to occur. The write enable circuitry comprises selective address modification circuitry for outputting as an internal address the unmodified n-bit address if the access request is a write access request, and for outputting as the internal address an n-bit unused address if the access request is not a write access request. Comparison circuitry then compares the internal address with the addresses of the storage elements in the group, and in the event of a match being detected, issues the write control signal to the corresponding storage element. Due to the selective modification performed by the selective address modification circuitry, a match will only be detected by the comparison circuitry for a write access request. This design enables a reduction in the size of the write enable circuitry to be achieved.

15 Claims, 9 Drawing Sheets

APPARATUS AND METHOD FOR CONTROLLING WRITE ACCESS TO A GROUP OF STORAGE ELEMENTS

BACKGROUND OF THE INVENTION

1. Field of the Invention

The present invention relates to an apparatus and method for controlling write access to a group of storage elements.

2. Background of the Invention

Many data processing systems include groups of storage elements for storing data for use by components within the data processing system. The data stored within such groups of storage elements is typically not static, and instead data can be written into storage elements and read from storage elements in response to access requests initiated by certain components within the data processing system.

One example of such a group of storage elements is a register file (also sometimes referred to as a register bank), where each of the storage elements takes the form of a register used to store data operated on by processing circuitry of the data processing system. For example, such register files are found in processor cores, providing working registers for use by the processor core when performing data processing operations. Another example of a group of storage elements is a group of control registers used to store control data used to control operation of an associated device. Such control registers may be provided for a number of components within the data processing system, for example a processor core, a peripheral device such as a Universal Asynchronous Receiver Transmitter (UART) device, etc.

Further, the groups of storage elements will not always be groups of registers. For example, storage structures such as the Translation Look-aside Buffers (TLBs) (often there will be a micro TLB and a main TLB) provided within a memory management unit (MMU) will typically provide a plurality of storage entries that can be considered to form a plurality of storage elements. Similarly, branch prediction units used to predict the outcome of branch operations also include storage structures such as branch history buffers (BHBs) and branch target buffers (BTBs) which can also be considered to comprise a plurality of storage elements.

Individual storage elements within such a group of storage elements are typically accessed in response to an access request specifying an address of the particular storage element in the group to be accessed. When the access request is a write access request requiring a write operation to be performed in the addressed storage element, the current contents of the addressed storage element will be overwritten with new write data passed to that storage element. To avoid any unintentional writing of storage elements, it is typical to provide write enable circuitry in association with the group of storage elements, which is responsible for detecting when an access request is a write access request, and only issuing a write control signal to an addressed storage element if it is detected that the access request is a write access request. Only in the presence of such a write control signal will the addressed storage element cause a write operation to occur in order to update its content.

In modern data processing systems, there is a general desire to make the individual components of the data processing system as small as possible. This enables the overall size to be reduced, thereby typically reducing the costs of manufacture, but also can give rise to power consumption reductions. Since write enable circuitry is typically provided in association with each group of storage elements, it would be desirable to provide a technique which enabled the size of write enable circuitry to be reduced.

SUMMARY OF THE INVENTION

Viewed from a first aspect, the present invention provides apparatus comprising: a group of storage elements, each storage element within said group being identified by an n-bit address, and the total number of storage elements in said group being less than 2 to the power of n ($2^n$); write enable circuitry, responsive to an access request specifying an n-bit address, to issue a write control signal to the storage element addressed by the access request in the event that the access request is a write access request, the write control signal causing a write to that addressed storage element to occur; the write enable circuitry comprising: selective address modification circuitry for outputting as an internal address the n-bit address specified by the access request if the access request is said write access request, and for outputting as the internal address an n-bit unused address if the access request is not said write access request, the n-bit unused address not identifying any of the storage elements in said group; and comparison circuitry for comparing the internal address with the addresses of the storage elements in the group, and in the event of a match between the internal address and the address of one of said storage elements, for issuing the write control signal to said one of said storage elements.

Within a group of storage elements, each storage element within the group is identified by an n-bit address. Purely by way of example, a four bit address will enable individual storage elements within a group to be uniquely addressed provided the total number of storage elements does not exceed 16. The inventor of the present invention observed that in practice certain groups of storage elements used within the data processing system have a total number of storage elements that is less than the maximum number of storage elements that can be addressed by the n-bit address, i.e. the total number of storage elements is less than $2^n$. For any group of storage elements where the total number of storage elements is less than $2^n$, the inventor of the present invention realised that there would be at least one value of the possible n-bit address values which would not actually be used to address a storage element in the group, and has found that the presence of such an unused address enables the write enable circuitry to be constructed in a way which significantly reduces the size of the write enable circuitry when compared with typical prior art constructions.

In particular, in accordance with the present invention, the write enable circuitry comprises selective address modification circuitry which creates an internal address for providing to comparison circuitry. If the access request is a write access request, the internal address is unchanged from the address provided by the access request, but if the access request is not a write access request, the selective address modification circuitry generates as the internal address an n-bit unused address which will not map to any of the storage elements in the group.

As a result, when the comparison circuitry then compares the generated internal address with the addresses of the storage elements in the group, then in the event of a match being detected, this means that the access request is definitely a write access request, and accordingly the comparison circuitry can directly issue a write control signal to the addressed storage element for which the match is detected. However, if the unused address is used as the internal address, it will be appreciated that the comparison circuitry will not detect any match, and accordingly no write control signal will be issued to any of the storage elements, thereby avoiding any unintentional write operation being performed.

In a typical prior art write enable circuit, comparison circuitry could be provided comprising a comparison block for each of the storage elements in the group, and each comparison block would have to receive both the n-bit address and some qualifying signal identifying whether the access request relates to a write access request or riot. However, in accordance with the present invention, individual comparison blocks provided within the comparison circuitry only need to receive an internal address which is n-bits in size and hence the size of each comparison block can be reduced when compared with equivalent comparison blocks provided in prior art write enable circuitry. This reduction far outweighs the extra size to provide the components required to implement the selective address modification circuitry (only needed once per write enable circuitry), and accordingly gives rise to a significant reduction in the size of the write enable circuitry.

There are a number of ways in which the write enable circuitry can detect when an access request is a write access request. In one embodiment, the access request is accompanied by an asserted write enable signal if that access request is said write access request, and the write enable signal is used by the selective address modification circuitry to determine whether to output as the internal address the n-bit address specified by the access request or said n-bit unused address. Accordingly, in such embodiments, the selective address modification circuitry uses the write enable signal to selectively modify the n-bit address, in particular the selective address modification circuitry leaving the address unmodified if the write enable signal is asserted, and modifying the n-bit address to be an n-bit unused address if the write enable signal is not asserted. The resulting internal address produced is then such that the comparison circuitry will only detect a match if the access request is a write access request, and hence can merely issue the write control signal to the relevant storage element once a match is detected. Similarly, if the access request is not a write access request, then due to the actions of the selective address modification circuitry, the comparison circuitry will not detect a match, and accordingly no write control signal will be issued.

The selective address modification circuitry can operate in a variety of ways. In one embodiment, the selective address modification circuitry performs a logical operation to logically combine each bit of the n-bit address with a signal derived from the write enable signal, such that if the write enable signal is asserted the n-bit address is output as the internal address, and if the write enable signal is not asserted the n-bit unused address is output as the internal address. The exact form of the logical operation will depend on the form of the unused address. However, in one embodiment the logical operation is a logical OR operation, which provides a mechanism for generating an unused address of n logic one values in the event that the access request is not a write access request.

There are a number of ways in which the signal to be logically combined with each bit of the n-bit address can be derived from the write enable signal. In one embodiment, the write enable signal is asserted at a high logic level, and is inverted in order to produce the signal logically combined with each bit on the n-bit address by the selective address modification circuitry. In another embodiment, the write enable signal is asserted at a low logic level, and is used directly as the signal logically combined with each bit on the n-bit address by the selective address modification circuitry.

The manner in which the write control signal issued to an addressed storage element by the comparison circuitry is used by the storage element to trigger the write operation to occur can take a variety of forms. Typically each storage element will comprise one or more storage sub-elements. For example, each storage sub-element may store a single bit value, and the storage element may be arranged to store a multi-bit data value by storing individual bits of that data value in individual storage sub-elements of the storage element. The write control signal can then be used to trigger each storage sub-element within the addressed storage element to initiate a write operation. This can be achieved in a variety of ways.

For example, in one embodiment, each storage sub-element is responsive to an asserted enable signal at an enable input to store data presented at its data input. In such embodiment, the write control signal may form the asserted enable signal, such that each of the storage sub-elements in the addressed storage element performs a write operation when the write control signal is issued.

Alternatively, each storage sub-element may be responsive to an asserted clock signal at a clock input to store data presented at its data input. In such cases, the write control signal issued by the comparison circuitry to an addressed storage element may cause the clock signal to be asserted to each of the storage sub-elements within that addressed storage element, thereby causing the write operation to take place.

In yet another alternative embodiment, each storage sub-element may have selection circuitry that is responsive to a selection signal to provide to a data input of that storage sub-element either incoming data or recirculated data output by the storage sub-element. In such embodiments, the write control signal issued by the comparison circuitry may be used to form the selection signal, so as to cause the storage sub-elements in the addressed storage element to receive at their data inputs the incoming data rather than the recirculated data, thereby causing the write operation to occur.

The storage elements can take a variety of forms. In one embodiment the storage elements are registers and said group comprises a register file used to store data operated on by processing circuitry of a data processing apparatus. As another example, the group may comprise a set of control registers used to control operation of an associated device. The associated device may take a variety of forms, for example a processor or a peripheral device for a data processing apparatus. Further, the storage elements need not be registers, and may in fact be any storage element structures grouped in a way where the total number of storage elements in the group is less than the number that can be uniquely addressed by the n-bit address. Dependent on how the storage structures are designed, the technique of embodiments of the present invention may hence be applicable to storage structures such as micro-TLBs, TLBs, BHBs, BTBs, etc.

As mentioned earlier, the present invention can be used for any group of storage elements where the total number of storage elements is less than $2^n$, since there will always then be at least one unused address. In some embodiments the total number of storage elements in said group is at least two less than $2^n$, resulting in an unused address set of at least two unused addresses. Whilst in such cases the selective address modification circuitry can be arranged to always produce the same unused address as the internal address whenever the access request issued is not a write access request, in other embodiments the selective address modification circuitry may be simplified by taking advantage of the fact that any unused address will be sufficient to cause correct operation. In particular, in one embodiment, if the access request is not said write access request, the selective address modification circuitry is arranged to modify the n-bit address specified by the access request only to the extent necessary to produce as the internal address an unused address within the unused address set.

Viewed from a second aspect, the present invention provides a method of controlling write access to a group of storage elements, each storage element within said group being identified by an n-bit address, and the total number of storage elements in said group being less than 2 to the power of n, the method comprising the steps of: employing write enable circuitry, responsive to an access request specifying an n-bit address, to issue a write control signal to the storage element addressed by the access request in the event that the access request is a write access request, the write control signal causing a write to that addressed storage element to occur; the write enable circuitry performing the steps of: (i) outputting as an internal address the n-bit address specified by the access request if the access request is said write access request, and outputting as the internal address an n-bit unused address if the access request is not said write access request, the n-bit unused address not identifying any of the storage elements in said group; and (ii) comparing the internal address with the addresses of the storage elements in the group; and (iii) in the event of a match between the internal address and the address of one of said storage elements being detected in said comparing step, issuing the write control signal to said one of said storage elements.

Viewed from a third aspect, the present invention provides apparatus comprising: a group of storage means, each storage means within said group being identified by an n-bit address, and the total number of storage means in said group being less than 2 to the power of n; write enable means, in response to an access request specifying an n-bit address, for issuing a write control signal to the storage means addressed by the access request in the event that the access request is a write access request, the write control signal for causing a write to that addressed storage means to occur; the write enable means comprising: selective address modification means for outputting as an internal address the n-bit address specified by the access request if the access request is said write access request, and for outputting as the internal address an n-bit unused address if the access request is not said write access request, the n-bit unused address not identifying any of the storage means in said group; and comparison means for comparing the internal address with the addresses of the storage means in the group, and in the event of a match between the internal address and the address of one of said storage means, for issuing the write control signal to said one of said storage means.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
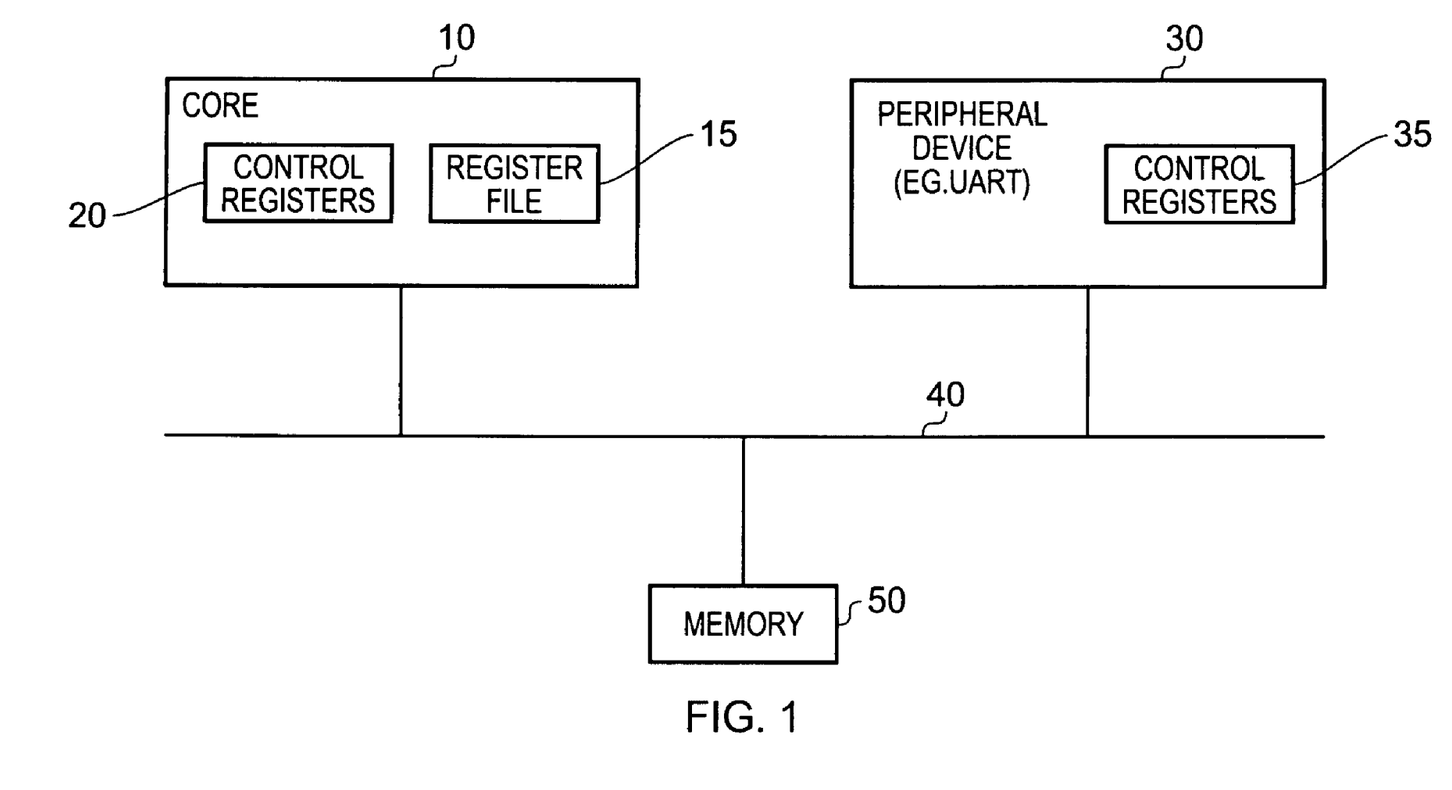
FIG. 1 is a block diagram illustrating a data processing apparatus in which the techniques of embodiments of the present invention may be employed.

FIG. 1 is a block diagram schematically illustrating a data processing apparatus in which the techniques of embodiments of the present invention may be employed. In this example data processing apparatus, a processor core 10 is connected via a bus network 40, with a peripheral device 30 and memory 50. Various groups of registers may be provided within both the processor core 10 and the peripheral device 30. In particular, as shown, the processor core will typically include a register file 15 containing a plurality of registers used as working registers by the execution pipeline of the core, with data values being written to the register file 15, and read from the register file 15, during the performance of data processing operations within the execution pipeline. Further, a group of control registers 20 may be provided within the core, with the values then stored in those control registers controlling the way in which the processor core operates. Again, these values may be both written to, and read from, during the time the processor core is running. Similarly, any peripheral devices such as the peripheral device 30 may also include groups of control registers 35 used to control the manner in which those peripheral devices operate. In the example illustrated in FIG. 1, the peripheral device may be a Universal Asynchronous Receiver Transmitter (UART) device used to convert parallel data into serial data, and vice versa. However, the peripheral device need not be a UART, and there are a wide variety of peripheral devices which will include such a group of control registers. Indeed, certain peripheral devices may also include a group of working registers analogous to the register file 15.

Since these groups of registers 15, 20, 35 can all be written to, they will typically include write enable circuitry to control the performing of write operations in respect of individual registers within those groups. In accordance with embodiments of the present invention, wherever the total number of registers within the group is less than the total number of addresses that can be specified by an n-bit address value used to address those registers, then the write enable circuitry can be constructed in accordance with embodiments of the present invention to provide a reduction in size when compared with typical prior art write enable circuits.

It should be noted that it is not only groups of registers which potentially can use the write enable circuitry of embodiments of the present invention, but in principle such write enable circuitry may be used in connection with any group of storage elements which can be written to, where the total number of storage elements in the group is less than the total number of unique addresses that can be specified by the n-bit address used to access those storage elements. Purely by way of example, a processor core will typically include a memory management unit (MMU) for performing virtual to physical address translation operations, and related memory access control functions, and often those MMUs will include one or more translation lookaside buffers (TLBs), each TLB having multiple TLB entries for storing access control information. Each TLB entry can be considered to be a storage element, with the TLB then representing a group of storage elements. Often such MMUs include both a micro-TLB and a main TLB, and both TLBs can independently be considered to form a group of storage elements. In situations where the number of TLB entries is less than the number of addresses which can be specified by the n-bit address value used to access those entries when writing, then the write enable circuitry associated with those TLBs can also be constructed using the techniques of embodiments of the present invention. Such write enable circuitry may also be used in connection with any other suitable storage structures within the data processing apparatus, for example branch history buffers (BHBs) or branch target buffers (BTBs) provided in a branch prediction unit used by the processor core 10.

For the purpose of describing the write enable circuitry of embodiments of the present invention, an example use case where the write enable circuitry is associated with a register file will now be considered.

Figure 2:
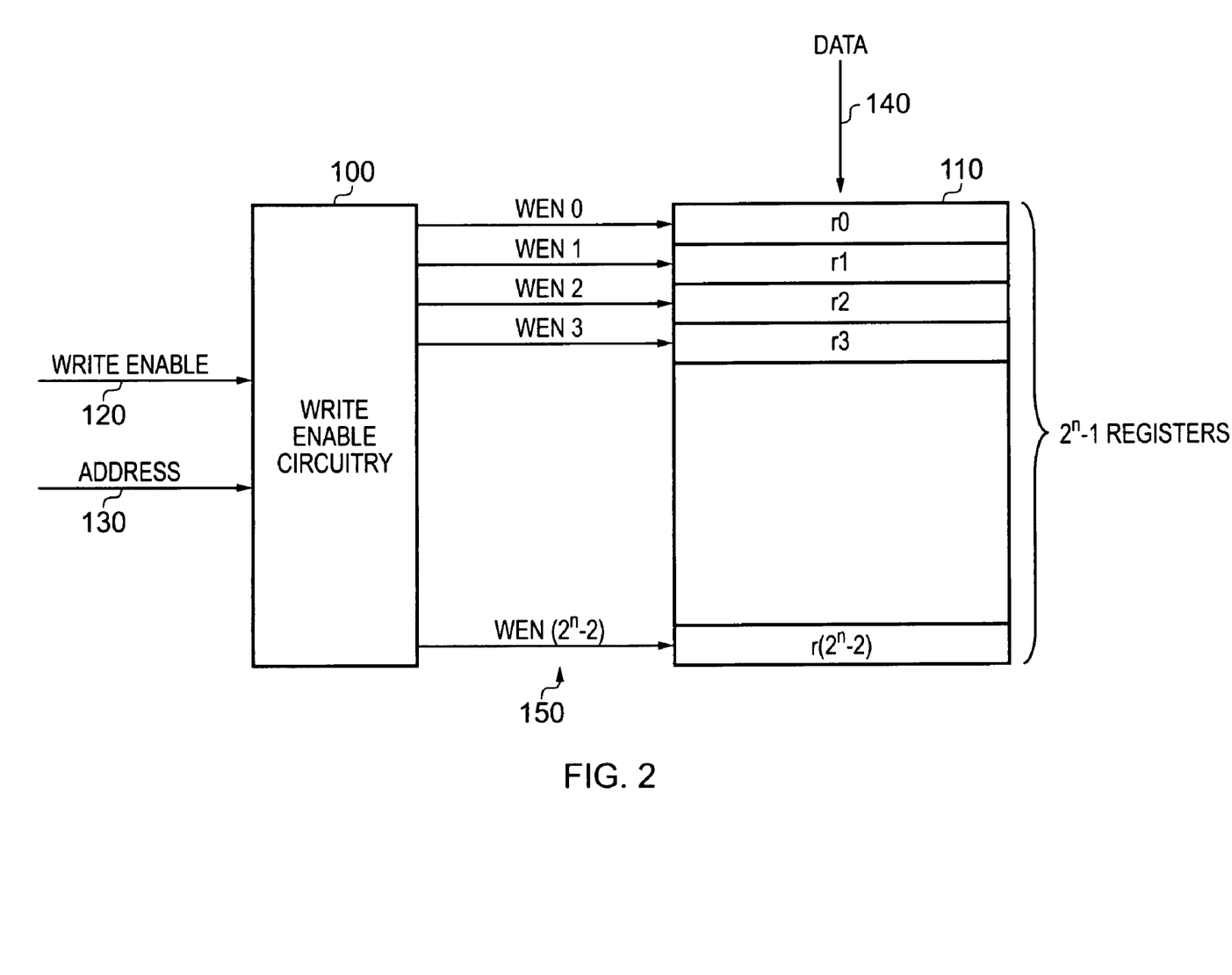
FIG. 2 schematically illustrates write enable circuitry for a register file in which embodiments of the present invention may be employed.

FIG. 2 shows a register file 110 comprising $2^n-1$ registers, namely registers r0 to r($2^n-2$). The write enable circuitry 100 is arranged to receive an n-bit address over path 130 specified by an access request, and also receives a write enable signal 120, when the write enable signal is asserted this indicating that a write access request has been issued. Based on this information, the write enable circuitry 100 determines the values of individual write enable (WEN) signals issued over path 150 to the various registers within the register file 110. In the event of a write access request, one of those WEN signals will be asserted, in order to indicate to the register specified by the address received over path 130 that it should perform a write operation. When the write enable signal 120 is not asserted, and accordingly no write access request has been issued, then none of the WEN signals will be asserted, and accordingly no write update will occur within any of the registers of the register file 110. Accordingly, it can be seen that only when a write access request is received, the data input over path 140 will be written into one of the registers of the register file 110 on receipt by that register of an asserted WEN signal.

An important feature of the register file 110 is that the total number of registers in the register file is less than the total number of addresses that can be specified by the n-bit address. In particular, it will be appreciated that with an n-bit address, $2^n$ addresses can be specified, enabling $2^n$ separate registers to be uniquely identified. In the example of FIG. 2, however, the total number of registers is less than $2^n$, and in this particular example is $2^n-1$. This means that there is one unused address. This fact is taken advantage of in order to provide a construction of write enable circuitry which is particularly space efficient when compared with prior art write enable circuits.

Figure 3:
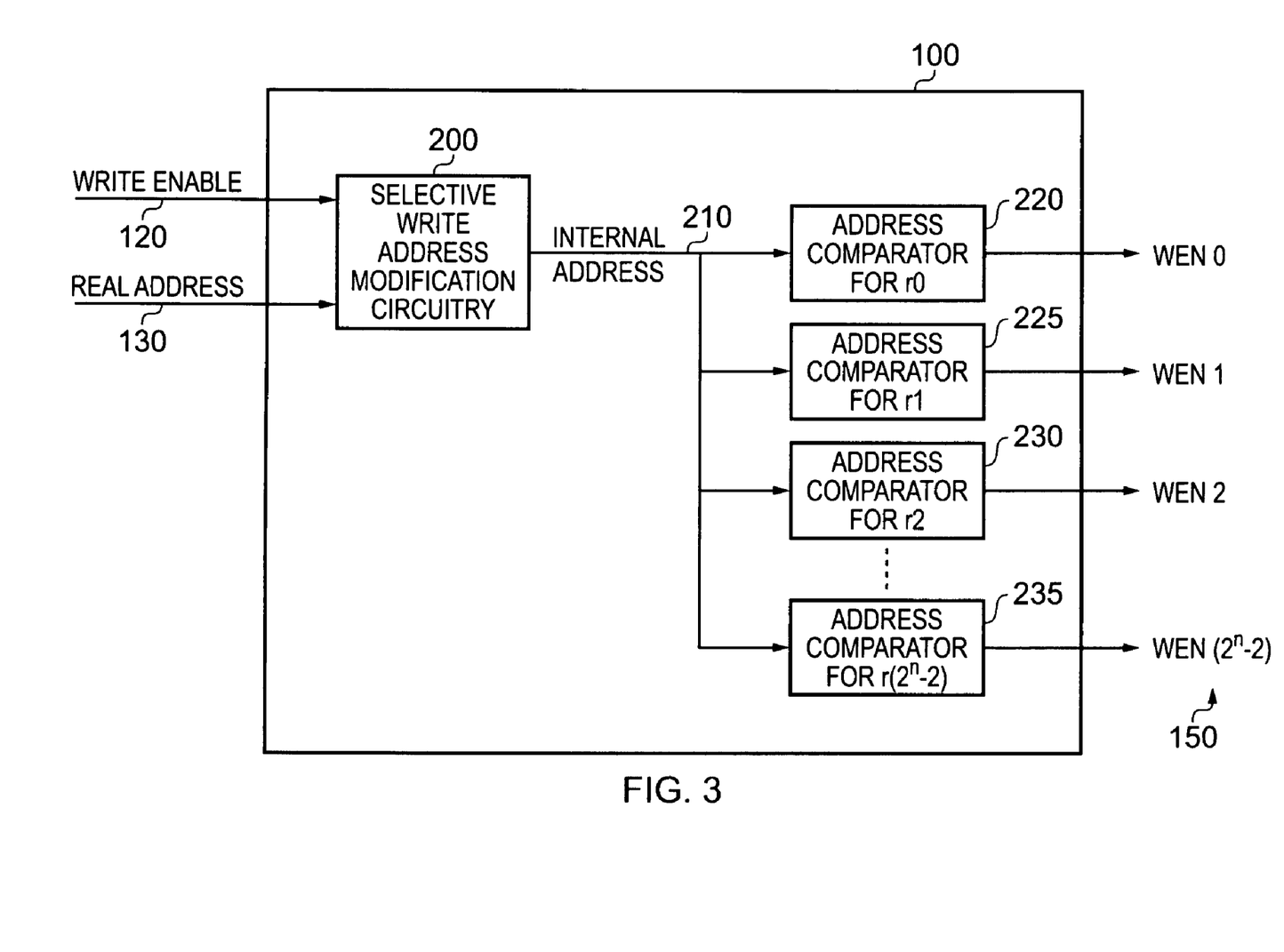
FIG. 3 illustrates the components provided within the write enable circuitry of FIG. 2 in accordance with one embodiment of the present invention.

The basic structure of the write enable circuitry 100 in accordance with embodiments of the present invention is illustrated in FIG. 3. In particular, selective write address modification circuitry 200 receives the real address input over path 130, and also receives the write enable signal 120. Based on these two inputs, the selective write address modification circuitry 200 produces an internal address which is routed over path 210 to a plurality of address comparators 220, 225, 230, 235. In particular, address comparator circuitry is provided for each register, and produces the corresponding WEN signal.

Figure 4:
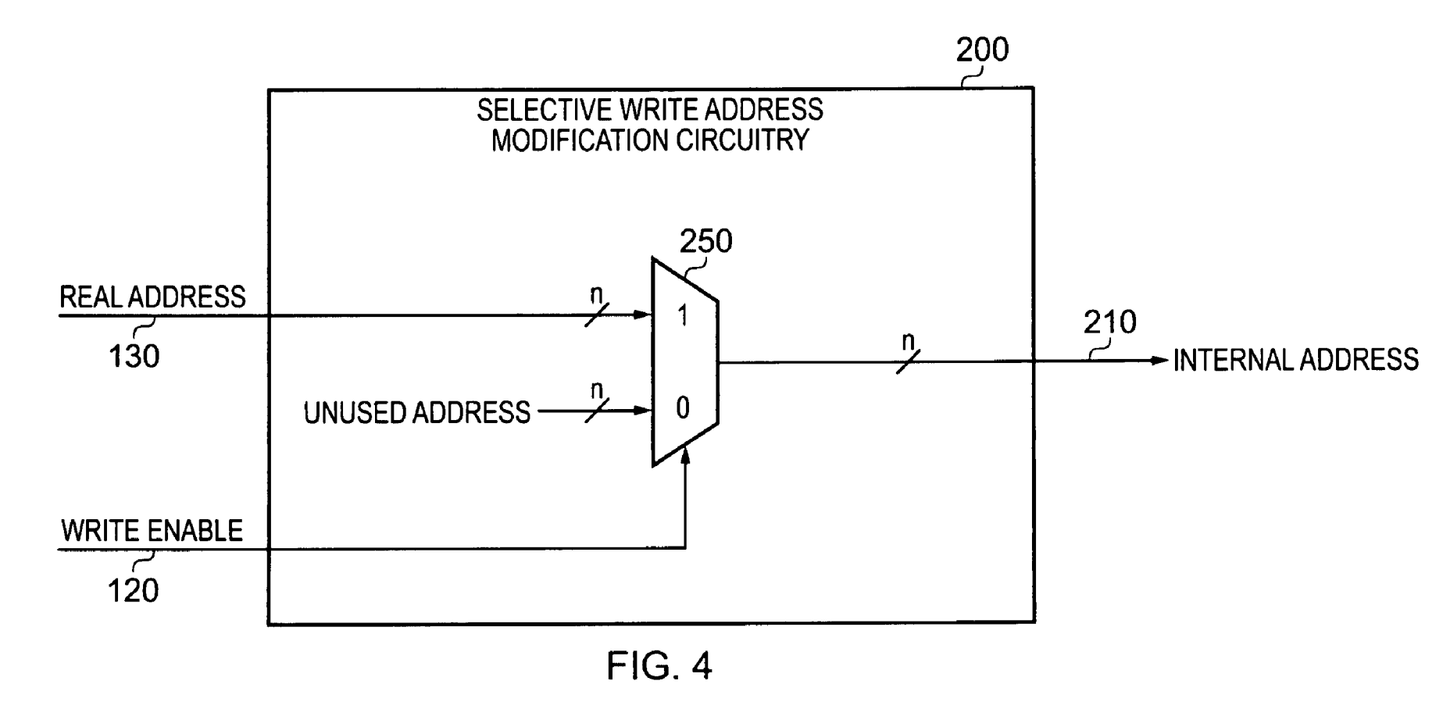
FIG. 4 schematically illustrates the function performed by the selective write address modification circuitry of FIG. 3 in accordance with one embodiment of the present invention.

FIG. 4 schematically illustrates the operation of the selective write address modification circuitry 200. The selective write address modification circuitry 200 includes components which operate as a multiplexer 250, such that in the event that a write enable signal is asserted (in the example of FIG. 4 it being assumed that the write enable signal is asserted at a logic one level) the real address is passed unmodified as the internal address output over path 210. However, whenever the write enable signal is not asserted, then an unused address is output as the internal address.

By this approach, when the individual address comparators 220, 225, 230, 235 compare the internal address with the address for their respective register, then for a write access request one of those address comparators will detect a match, and will set the corresponding WEN signal to identify to the addressed register that a write operation should be performed. All of the other WEN signals will not be set, since none of the other address comparators will detect a match. It is important to note that at this point the address comparators do not also need to check that the operation is a write operation, since the operation of the selective write address modification circuitry has ensured that the address comparators could only detect a match in the event of a write access request. In particular, when the access request is not a write access request, the internal address will take the form of an unused address, and accordingly none of the address comparators 220, 225, 230, 235 will detect a match. Accordingly in the absence of an asserted write enable signal 120, none of the WEN signals will be asserted, and accordingly none of the registers within the register file 110 will perform a write operation.

Figure 5:
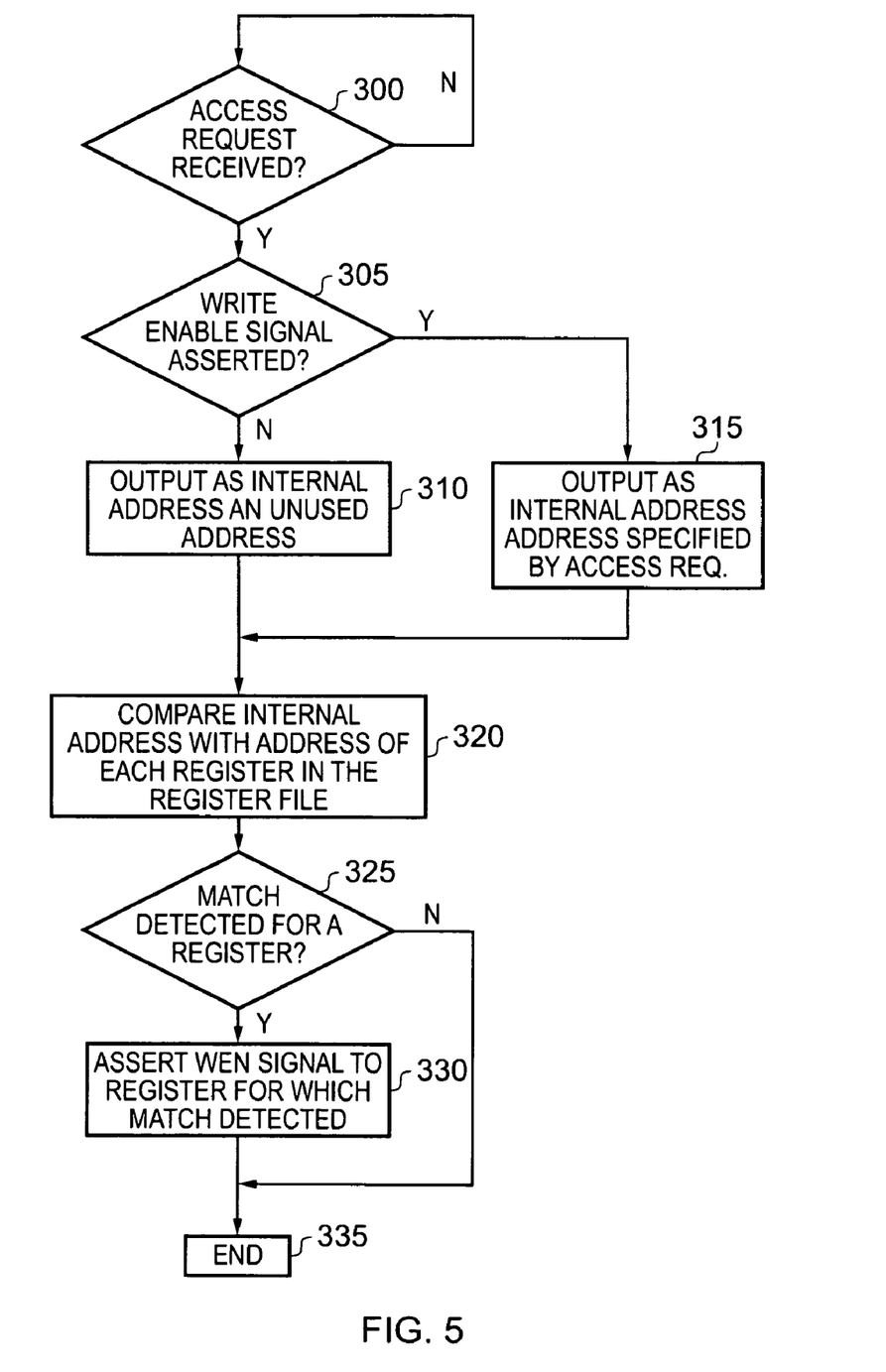
FIG. 5 is a flow diagram illustrating the operation of the write enable circuitry in accordance with one embodiment of the present invention.

FIG. 5 is a flow diagram schematically illustrating the operation of the write enable circuitry in accordance with one embodiment of the present invention. At step 300, receipt of an access request is awaited, and upon receipt of an access request the process proceeds to step 305, where it is determined whether the write enable signal is asserted. If the write enable signal is asserted, then the process proceeds to step 315, where the selective write address modification circuitry 200 outputs as the internal address the real address specified by the access request, i.e. the address received over path 130. However, if the write enable signal is not asserted, then the selective write address modification circuitry 200 outputs at step 310 an unused address as the internal address.

Thereafter, the process proceeds to step 320, where the comparison circuitry 220, 225, 230, 235 compares the internal address with the address of each register in the register file 110. Thereafter, at step 325, it is determined whether a match has been detected for any of the registers. If so, then at step 330 a WEN signal is asserted to the register for which the match was detected, thereby causing a write update to occur in that register. If no match is detected, then this means that the access request was not a write access request, and accordingly no action is taken. The process then ends at step 335.

Figure 6A:
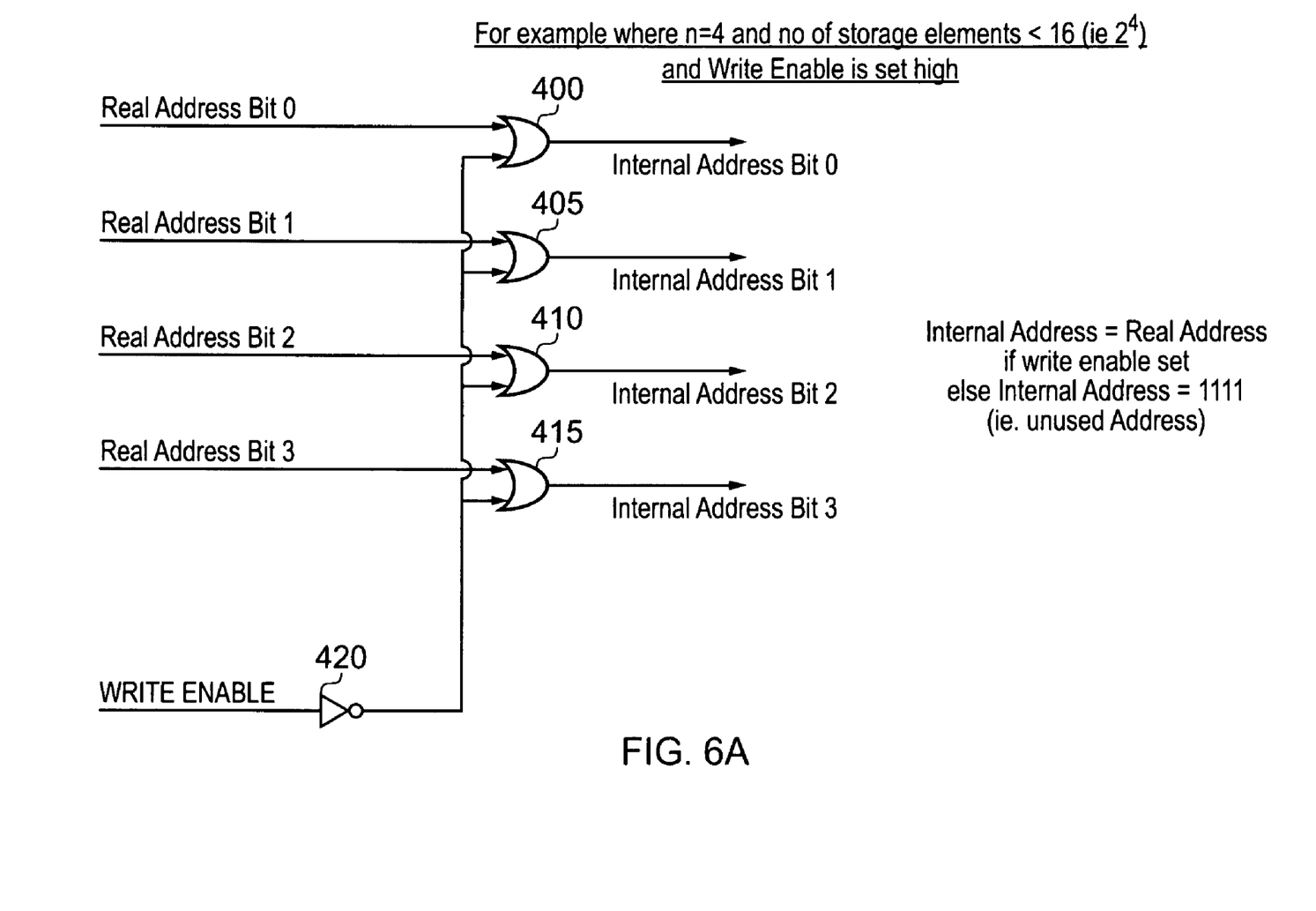
FIGS. 6A and 6B illustrate components provided within the selective write address modification circuitry in accordance with two different embodiments of the present invention.

FIG. 6A illustrates the components provided within the selective write address modification circuitry 200 for an example where n is 4, i.e. a 4-bit real address is issued, and the number of storage elements is less than 16, thereby meaning that there is at least one unused address. In this example, it is assumed that the write enable signal is set high to indicate a write access request. As shown in FIG. 6A, the write enable signal is inverted by the inverter 420 and then subjected to a logical OR operation where the inverted write enable signal is logically OR-ed with each bit of the real address. This function is performed by the OR gates 400, 405, 510, 415, with the output from each OR gate representing one address bit of the internal address. Accordingly, it can be seen that from the 4-bit real address, a 4-bit internal address is produced. When the write enable signal is asserted at a logic one level to indicate a write operation, then each of the OR gates 400, 405, 410, 415 receives at its lower input a logic zero value, and accordingly the output internal address is identical to the received real address. However, when the write enable signal is not asserted, each of the OR gates 400, 405, 410, 415 will receive a logic one value at its lower input, and accordingly the internal address will take the value 1111 irrespective of the received real address. In this example, it is assumed that the address 1111 is an unused address and hence an internal address of 1111 will never result in a match by any of the address comparators within the write enable circuitry.

Figure 6B:
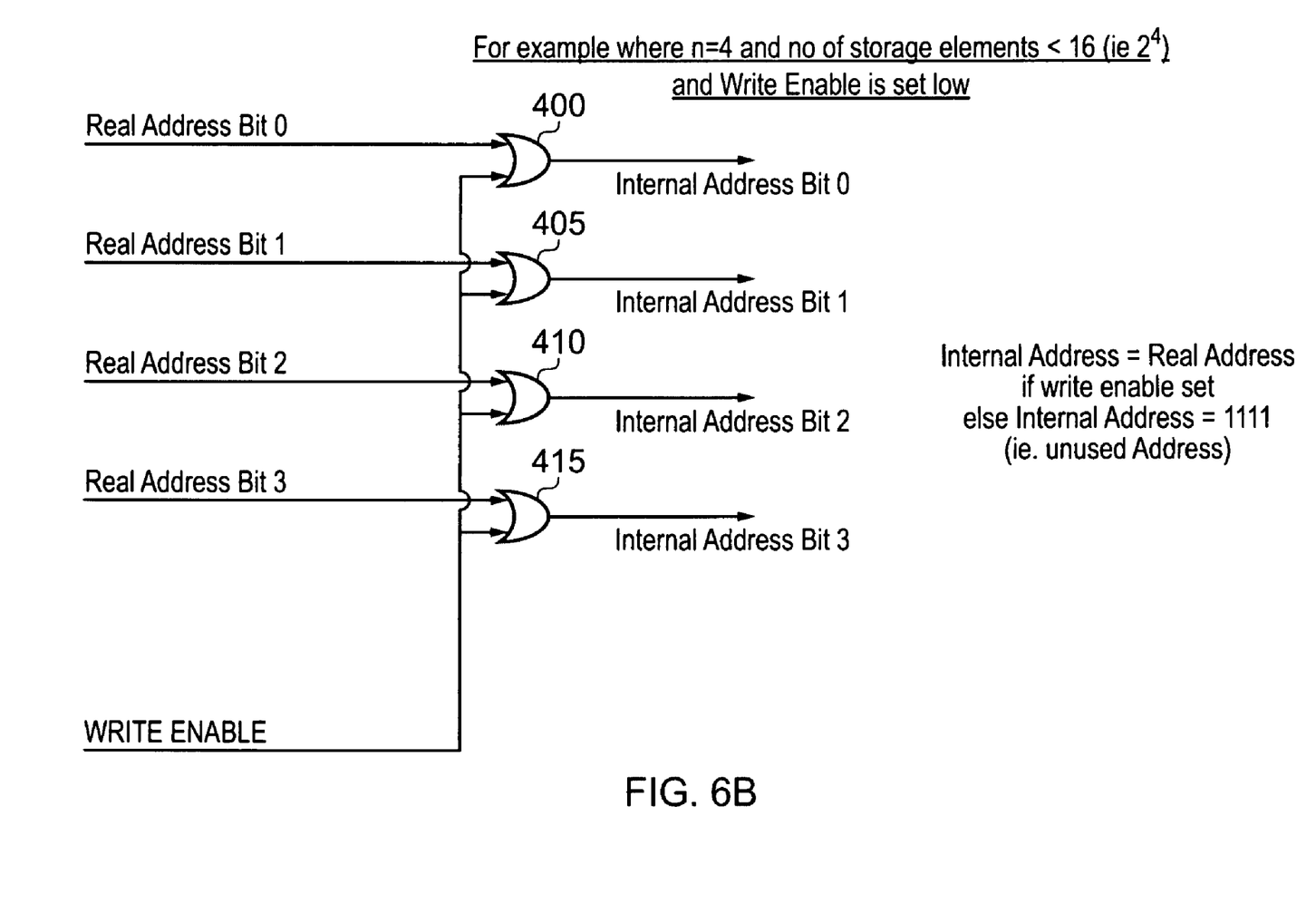

FIG. 6B illustrates an alternative construction of selective write address modification circuitry for an embodiment where the write enable signal is asserted at a logic low level, i.e. a logic zero write enable signal indicates a write operation. In this case, the inverter 420 is not needed, and with the inverter omitted the circuitry of FIG. 6B operates in an identical manner to the circuitry of FIG. 6A.

It will be appreciated that the exact form of the components provided within the selective write address modification circuitry will depend on the form of the unused address, and for example certain OR gates could be replaced with alternative logical gates if the unused address is anything other than 1111.

In the above embodiment, the selective write address modification circuitry produces the same unused address as the internal address, even if there are multiple unused addresses, as would be the case wherever the total number of storage elements in the group is at least two less than $2^n$, thus resulting in an unused address set of at least two unused addresses. However, in an alternative embodiment, the selective write address modification circuitry may be simplified by taking advantage of the fact that any unused address will be sufficient to cause correct operation. In particular, in one embodiment, if the access request is not said write access request, the selective address modification circuitry is arranged to modify the n-bit address specified by the access request only to the extent necessary to produce as the internal address an unused address within the unused address set.

Hence, by way of example, if we consider the earlier example where n is 4, it may be the case that both the addresses 1000 and 1001 are unused. In such instances, if the write enable signal is not asserted, indicating the access is not a write access, it is sufficient for the selective write address modification circuitry to modify the top three bits to be 100 and to allow the least significant bit of the 4-bit real address to be propagated unchanged as the least significant bit of the internal address. Whilst this means that the unused address produced is not always the same (in the above example it will sometimes be 1000 and sometimes will be 1001), it will always be an unused address within the unused address set, and accordingly will always cause correct operation in that none of the address comparators 220, 225, 230, 235 will detect a match.

Figure 7A:
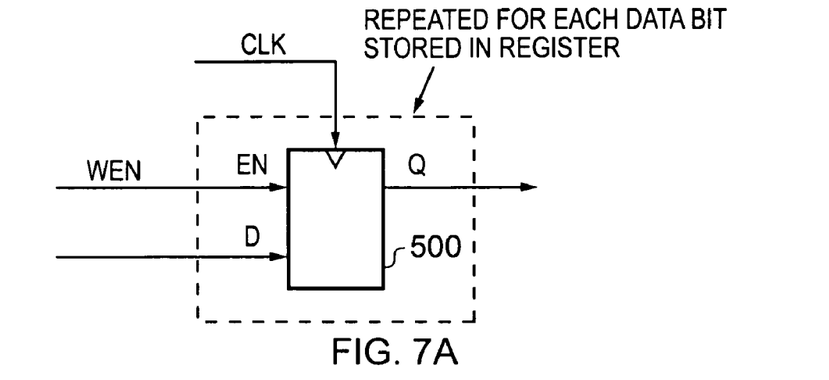
FIGS. 7A to 7C illustrate three different ways in which the WEN signals issued by the write enable circuitry of embodiments of the present invention may be used to control the individual storage sub-elements within an addressed register.
Figure 7B:
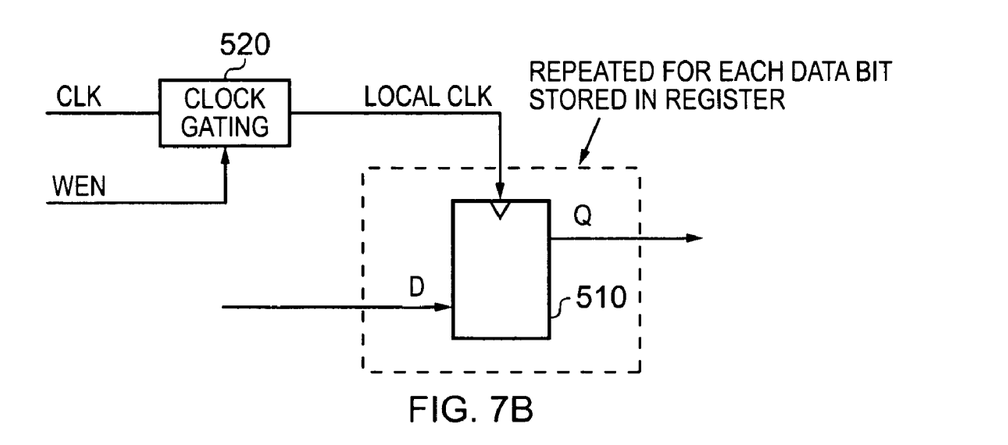
Figure 7C:
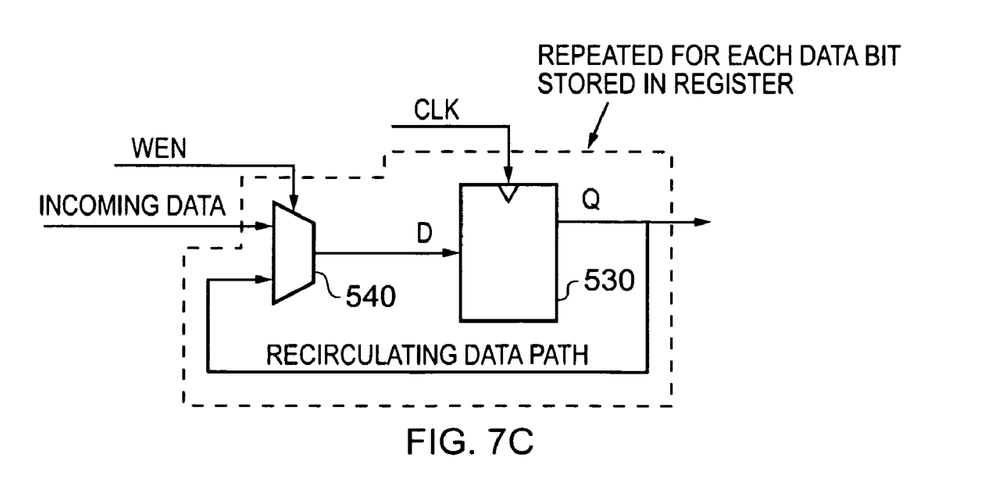

The manner in which the various WEN signals are used by the registers may take a variety of forms. FIGS. 7A to 7C illustrate three different embodiments that could be used. In FIG. 7A, the register is constructed of a plurality of flip flop devices 500, each flip flop storing a single bit value. In this example, each clock cycle, the flip flop 500 will store the incoming data at its D input only if the enable input is asserted. In this embodiment, if the WEN signal is asserted indicating that a write operation should occur in the addressed register, then that asserted WEN signal can be used to provide the enable input to the flip flop 500 thereby causing the write operation to take place.

In FIG. 7B, a clock gated flip flop 510 is used to form each storage sub-element within the register. Accordingly, in this example, the flip flop 510 does not require a separate enable input, but will only store the incoming data at its D input in response to a local clock signal, the local clock signal only being asserted for a write access request addressing that register. In this embodiment, clock gating circuitry 520 can be used to generate the local clock signal from a global clock signal, and the WEN signal issued by the associated address comparator can be used to determine when to activate the local clock. In particular, when the WEN signal is asserted, indicating that a write operation should occur to the addressed register, then the clock gating circuitry 520 can assert the local clock signal in order to cause the data to be stored in each flip flop 510 of the register. In this example, it is worth noting that the WEN signal only needs to be routed to the signal clock gating circuit 520, and not to each individual flip flop within the register.

FIG. 7C illustrates an alternative storage sub-element structure where the flip flop 530 is driven by the global clock signal, and the multiplexer 540 is used to determine what data value is provided to the D input of the flip flop 530. The multiplexer 540 receives incoming data at one of its inputs, and at the other input receives the output from the flip flop 530. In the absence of a write operation, the recirculating data path can be used to ensure that the contents in the flip flop 530 remain unchanged. However, in the event of a write operation, assertion of the corresponding WEN signal can be used to cause the incoming data to be routed to the D input, in order to cause the write operation to occur under the control of the clock signal.

By constructing the write enable circuitry in the manner discussed above, a significantly reduction in the size of the write enable circuitry can be realised. In particular, through the provision of the selective write address modification circuitry 200 which needs to be provided only once for the entire write enable circuitry, the size of each of the address comparator blocks can be reduced. This will be appreciated when comparing the structure of embodiments of the present invention with a typical prior art write enable circuit, such as that shown in FIG. 8. In such a prior art write enable circuit, separate comparison circuits 600, 620, 640 are provided for each register, and each comparison circuitry 600, 620, 640 includes comparison blocks 605, 625, 645 for comparing the incoming n-bit address with the address for the associated register, thereby producing a one bit value identifying whether a match has been detected or not. In addition, each comparison circuit 600, 620, 640 includes AND gate circuitry 610, 630, 650 for determining in the event of a match condition whether a write operation is actually required. In particular, the write enable signal is provided to one input of the AND gates, whilst the output from the various comparison blocks is provided as the other input. Accordingly, only if a match is detected, and the write enable signal is asserted, will the WEN signal be asserted to the corresponding register.

Figure 8:
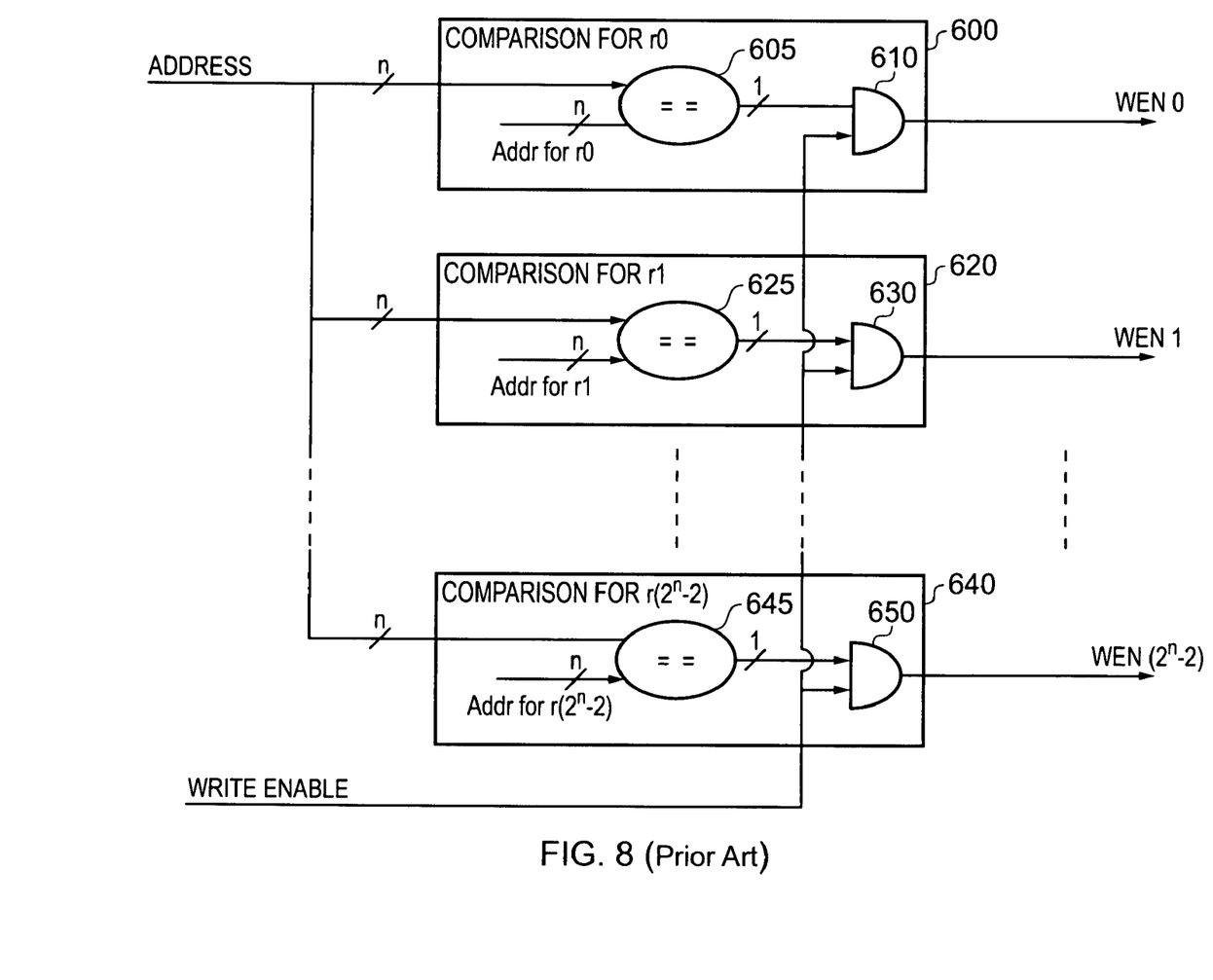
FIG. 8 schematically illustrates the structure of a prior art write enable circuit.

Hence, considering a situation where the register file includes fifteen registers addressed by a 4-bit address value, it will be seen that the prior art circuitry of FIG. 8 requires fifteen comparison blocks each of which receives five bits of input, and produces one bit of output. By comparison, using the techniques of embodiments of the present invention, the fifteen comparison blocks only need to receive four bits of input in order to produce the one bit of output. To achieve this reduction, it is merely necessary to provide once for the write enable circuitry the components such as those shown in FIGS. 6A and 6B, i.e. four simple logic components each taking two inputs and producing one output. This represents a significant size reduction for the write enable circuitry, and this size reduction can be replicated for any groups of storage elements within the data processing apparatus where the total number of storage elements is less than the total number of unique addresses that can be generated using the n-bit address.

Although a particular embodiment has been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

I claim:

1. Apparatus comprising:
   a group of storage elements, each storage element within said group being identified by an n-bit address, and the total number of storage elements in said group being less than 2 to the power of n;
   write enable circuitry, responsive to an access request specifying an n-bit address, to issue a write control signal to the storage element addressed by the access request in the event that the access request is a write access request, the write control signal causing a write to that addressed storage element to occur;
   the write enable circuitry comprising:
      selective address modification circuitry for outputting as an internal address the n-bit address specified by the access request if the access request is said write access request, and for outputting as the internal address an n-bit unused address if the access request is not said write access request, the n-bit unused address not identifying any of the storage elements in said group; and
      comparison circuitry for comparing the internal address with the addresses of the storage elements in the group, and in the event of a match between the internal address and the address of one of said storage elements, for issuing the write control signal to said one of said storage elements.

2. Apparatus as claimed in claim 1, wherein the access request is accompanied by an asserted write enable signal if that access request is said write access request, and the write enable signal is used by the selective address modification circuitry to determine whether to output as the internal address the n-bit address specified by the access request or said n-bit unused address.

3. Apparatus as claimed in claim 2, wherein said selective address modification circuitry performs a logical operation to logically combine each bit of the n-bit address with a signal derived from the write enable signal, such that if the write enable signal is asserted the n-bit address is output as the internal address, and if the write enable signal is not asserted the n-bit unused address is output as the internal address.

4. Apparatus as claimed in claim 3, wherein the logical operation is a logical OR operation.

5. Apparatus as claimed in claim 3, wherein the write enable signal is asserted at a high logic level, and is inverted in order to produce the signal logically combined with each bit on the n-bit address by the selective address modification circuitry.

6. Apparatus as claimed in claim 3, wherein the write enable signal is asserted at a low logic level, and is used directly as the signal logically combined with each bit on the n-bit address by the selective address modification circuitry.

7. Apparatus as claimed in claim 1, wherein each storage element comprises one or more storage sub-elements, each storage sub-element being responsive to an asserted enable signal at an enable input to store data presented at its data input, the write control signal issued to said one of said storage elements by said comparison circuitry comprising said asserted enable signal.

8. Apparatus as claimed in claim 1, wherein each storage element comprises one or more storage sub-elements, each storage sub-element being responsive to an asserted clock signal at a clock input to store data presented at its data input, the write control signal issued to said one of said storage elements by said comparison circuitry causing said clock signal to be asserted.

9. Apparatus as claimed in claim 1, wherein each storage element comprises one or more storage sub-elements, each storage sub-element having selection circuitry responsive to a selection signal to provide to a data input of the storage sub-element either incoming data or data output by the storage sub-element, the write control signal issued to said one of said storage elements by said comparison circuitry forming the selection signal so as to cause the one or more storage sub-elements of that storage element to receive at their data inputs the incoming data.

10. Apparatus as claimed in claim 1, wherein said storage elements are registers and said group comprises a register file used to store data operated on by processing circuitry of a data processing apparatus.

11. Apparatus as claimed in claim 1, wherein said storage elements are registers and said group comprises a set of control registers used to control operation of an associated device.

12. Apparatus as claimed in claim 11, wherein said device is a processor or a peripheral device of a data processing apparatus.

13. Apparatus as claimed in claim 1, wherein:
   the total number of storage elements in said group is at least two less than 2 to the power of n, resulting in an unused address set of at least two unused addresses; and
   if the access request is not said write access request, said selective address modification circuitry is arranged to modify the n-bit address specified by the access request only to the extent necessary to produce as the internal address an unused address within the unused address set.

14. A method of controlling write access to a group of storage elements, each storage element within said group being identified by an n-bit address, and the total number of storage elements in said group being less than 2 to the power of n, the method comprising the steps of:
   employing write enable circuitry, responsive to an access request specifying an n-bit address, to issue a write control signal to the storage element addressed by the access request in the event that the access request is a write access request, the write control signal causing a write to that addressed storage element to occur;
   the write enable circuitry performing the steps of:
      (i) outputting as an internal address the n-bit address specified by the access request if the access request is said write access request, and outputting as the internal address an n-bit unused address if the access request is not said write access request, the n-bit unused address not identifying any of the storage elements in said group; and
      (ii) comparing the internal address with the addresses of the storage elements in the group; and
      (iii) in the event of a match between the internal address and the address of one of said storage elements being detected in said comparing step, issuing the write control signal to said one of said storage elements.

15. Apparatus comprising:
a group of storage means, each storage means within said group being identified by an n-bit address, and the total number of storage means in said group being less than 2 to the power of n;
write enable means, in response to an access request specifying an n-bit address, for issuing a write control signal to the storage means addressed by the access request in the event that the access request is a write access request, the write control signal for causing a write to that addressed storage means to occur;
the write enable means comprising:
selective address modification means for outputting as an internal address the n-bit address specified by the access request if the access request is said write access request, and for outputting as the internal address an n-bit unused address if the access request is not said write access request, the n-bit unused address not identifying any of the storage means in said group; and
comparison means for comparing the internal address with the addresses of the storage means in the group, and in the event of a match between the internal address and the address of one of said storage means, for issuing the write control signal to said one of said storage means.

* * * * *